(12) United States Patent
Olgado

(10) Patent No.: US 7,101,253 B2
(45) Date of Patent: Sep. 5, 2006

(54) LOAD CUP FOR CHEMICAL MECHANICAL POLISHING

(75) Inventor: Donald J. K. Olgado, Palo Alto, CA (US)

(73) Assignee: Applied Materials Inc., Santa Clara, CA (US)

(*) Notice: Subject to any disclaimer, the term of this patent is extended or adjusted under 35 U.S.C. 154(b) by 45 days.

(21) Appl. No.: 10/621,303

(22) Filed: Jul. 16, 2003

(65) Prior Publication Data
US 2004/0127142 A1 Jul. 1, 2004

Related U.S. Application Data

(60) Provisional application No. 60/406,469, filed on Aug. 27, 2002.

(51) Int. Cl.
B24B 29/00 (2006.01)

(52) U.S. Cl. .......................... 451/5; 451/339
(58) Field of Classification Search ................ 451/5, 451/41, 66, 67, 339, 331
See application file for complete search history.

(56) References Cited

U.S. PATENT DOCUMENTS

| | | | |
|---|---|---|---|
| 5,329,732 A | 7/1994 | Karlsrud et al. | 451/289 |
| 5,738,574 A | 4/1998 | Tolles et al. | 451/288 |
| 5,762,543 A | 6/1998 | Kasprzyk et al. | 451/262 |
| 5,934,984 A | 8/1999 | Togawa et al. | 451/288 |
| 5,947,802 A | 9/1999 | Zhang et al. | 451/334 |
| 6,068,544 A * | 5/2000 | Chiu et al. | 451/67 |
| 6,074,275 A | 6/2000 | Yashiki et al. | 451/5 |
| 6,102,777 A | 8/2000 | Duescher et al. | |
| 6,131,589 A | 10/2000 | Vogtmann et al. | |
| 6,196,896 B1 | 3/2001 | Sommer | |
| 6,648,730 B1 * | 11/2003 | Chokshi et al. | 451/6 |
| 6,716,086 B1 | 4/2004 | Tobin | |
| 2003/0003848 A1 | 1/2003 | Tobin | 451/11 |

FOREIGN PATENT DOCUMENTS

| | | |
|---|---|---|
| EP | 0 347 718 | 12/1989 |
| SU | 1323350 | 7/1987 |
| WO | 99/1022 | 8/1999 |

* cited by examiner

Primary Examiner—Jacob K. Ackun, Jr.
(74) Attorney, Agent, or Firm—Moser, Patterson & Sheridan (57) ABSTRACT

A load cup for transferring a substrate in a chemical mechanical polishing system is provided. In one embodiment, a load cup for transferring substrates in a chemical mechanical polishing system includes a substrate support having a first side adapted to support a substrate thereon and at least one actuator coupled to the substrate support and adapted to move the substrate support laterally. In another embodiment, a method for transferring a substrate between a polishing head and a load cup includes sensing a position of the polishing head relative to the load cup and automatically aligning the load cup and polishing head in response to the sensed relative position.

10 Claims, 11 Drawing Sheets

LOAD CUP FOR CHEMICAL MECHANICAL POLISHING

CROSS REFERENCE RELATED PATENT APPLICATIONS

This application claims benefit of U.S. Provisional Application No. 60/406,469, filed Aug. 27, 2002, which is hereby incorporated by reference in its entirety.

BACKGROUND OF THE INVENTION

1. Field of the Invention

Embodiments of the invention generally relate to a load cup for transferring substrates in a chemical mechanical polishing system.

2. Background of the Related Art

Chemical mechanical polishing generally removes material from a semiconductor substrate through a chemical or a combined chemical and mechanical process. In a typical chemical mechanical polishing system, a wafer is held by a polishing head in a feature side down orientation above a polishing surface. The polishing head is lowered to place the substrate in contact with the polishing surface. The substrate and polishing surface are removed relative to one another in a predefined polishing motion. A polishing fluid is typically provided on the polishing surface to drive the chemical portion of the polishing activity. Some polishing fluids may include abrasives to mechanically assist in the removal of material from the substrate.

A wafer transfer mechanism, commonly referred to as a load cup, is utilized to transfer the substrate into the polishing head in a feature side down orientation. As the feature side of the substrate faces the load cup while the substrate is retained therein, care must be taken to avoid damage to the feature side of the substrate through contact with the load cup. For example, the feature side of the substrate may be scratched by surfaces of the load cup that supports the substrate or moves the substrate during the transfer process with the polishing head. Additionally, particulates generated during the substrate transfer or generated by contact of the substrate to the load cup may be carried on the substrate's surface to the polishing surface. During polishing, these particulates may cause substrate scratching, which results in non-uniform polishing and device defects. Therefore, it would be advantageous to minimize substrate to load cup contact.

Particulate and substrate damage may also result from misalignment between the load cup and the polishing head. Typically, the load cup and the polishing head are positioned relative to each other with close tolerances to ensure trouble-free operation. However, over the course of multiple substrate transfers, the polishing head and load cup may become misaligned relative to one another, resulting in undesirable substrate contact with the load cup and/or the polishing head. Moreover, as some polishing systems include multiple polishing heads that are loaded by a single load cup, maintaining the positional tolerances of all of the polishing heads relative to a single load cup is difficult, and the potential for load cup to polishing head misalignment and subsequent substrate damage is great.

Therefore, there is a need for a load cup that minimizes substrate damage and/or contamination during the transfer of a substrate with a polishing head.

SUMMARY OF THE INVENTION

A load cup for transferring a substrate in a chemical mechanical polishing system is provided. In one embodiment, a load cup for transferring substrates in a chemical mechanical polishing system includes a substrate support having a first side adapted to support a substrate thereon and at least one actuator coupled to the substrate support and adapted to move the substrate support laterally. In another embodiment, a method for transferring a substrate between a polishing head and a load cup includes sensing a position of the polishing head relative to the load cup and automatically aligning the load cup and polishing head in response to the sensed relative position.

BRIEF DESCRIPTION OF THE DRAWINGS

A more particular description of the invention, briefly summarized above, may be had by reference to the embodiments thereof that are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

Figure 1:
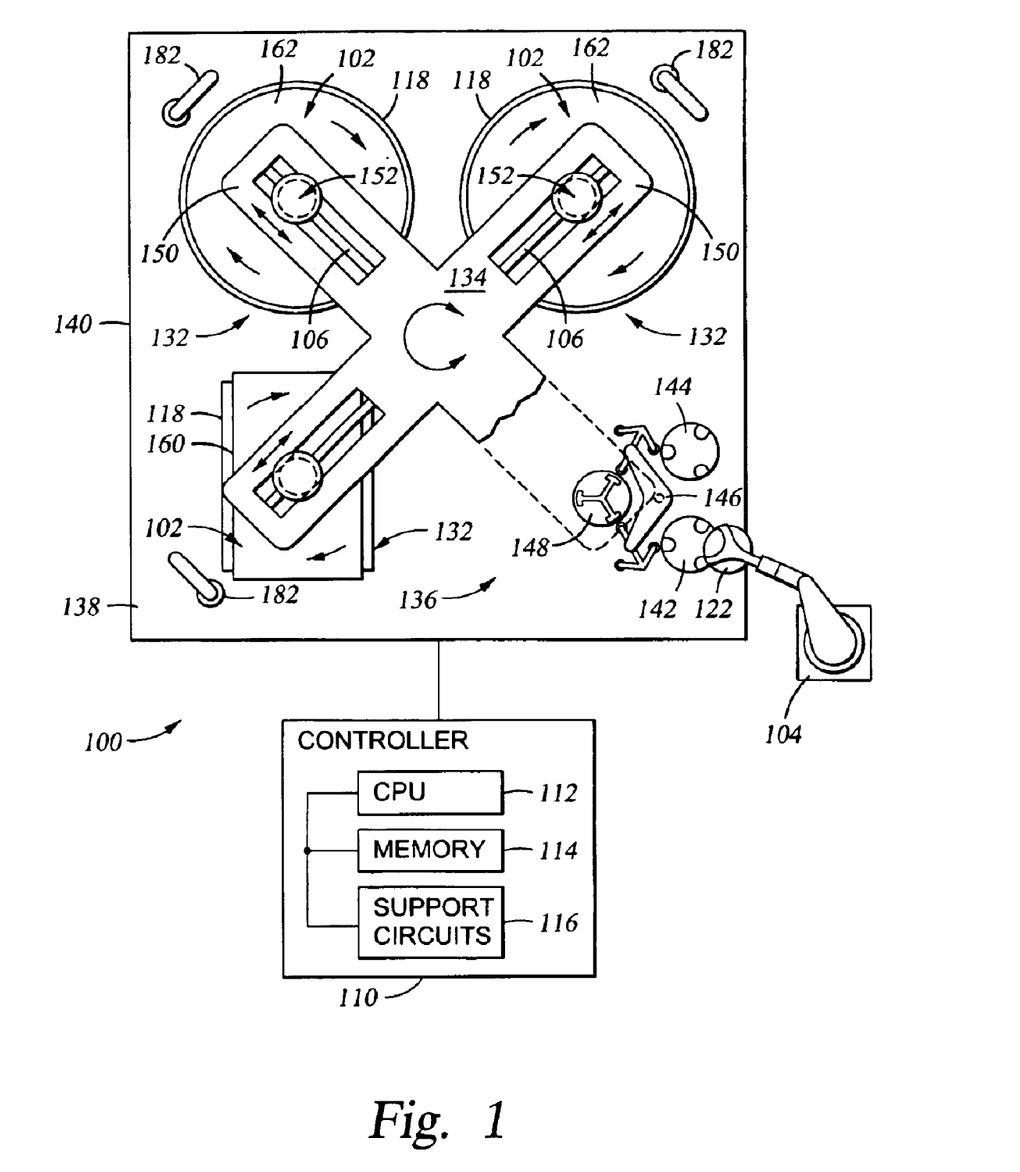
FIG. 1 is a plan view of one embodiment of a chemical mechanical polisher.

FIG. 1 depicts a plan view of one embodiment of a chemical mechanical polisher 100 having a load cup assembly 148 configured to minimize substrate damage. Examples of polishers that can be used to advantage with the present invention include MIRRA® and REFLEXION® chemical mechanical polishers, both available from Applied Materials, Inc., located in Santa Clara, Calif. Examples of other polishers that can be used to advantage with the present invention are described in U.S. Pat. No. 5,804,507, issued Sep. 8, 1998 and U.S. Pat. No. 6,244,935, issued Jun. 12, 2001, both of which are incorporated by reference in their entireties. Although the load cup assembly 148 is described as utilized on one configuration of a chemical mechanical polisher, one skilled in the art may advantageously adapt embodiments of load cup assembly 148 as taught and described herein to be employed on other chemical mechanical polishers, including those that utilize one or more webs of polishing material.

The exemplary polisher 100 includes a loading robot 104, a controller 110, a transfer station 136, a plurality of polishing stations 132, a base 140 and a carousel 134 that supports a plurality of polishing heads 152. Generally, the loading robot 104 is disposed proximate the polisher 100 and a factory interface (not shown) to facilitate the transfer of substrates 122 therebetween.

To facilitate control of the polisher 100 as described above, the controller 110 comprising a central processing unit (CPU) 112, support circuits 116 and memory 114, is coupled to the polisher 100. The CPU 112 may be one of any form of computer processor that can be used in an industrial setting for controlling various polishers, drives, robots and subprocessors. The memory 114 is coupled to the CPU 112. The memory 114, or computer-readable medium, may be one or more of readily available memory such as random access memory (RAM), read only memory (ROM), floppy disk, hard disk, or any other form of digital storage, local or remote. The support circuits 116 are coupled to the CPU 112 for supporting the processor in a conventional manner. These circuits include cache, power supplies, clock circuits, input/output circuitry, subsystems, and the like.

The carousel 134 has a plurality of arms 150 that each support one of the polishing heads 152. One of the arms 150 depicted in FIG. 1 are shown in phantom such that the transfer station 136 may be seen. The carousel 134 is indexable such that the polishing heads 152 may be moved between the polishing stations 132 and the transfer station 136.

Each polishing station 132 includes a platen 118 that supports a polishing material 102. The platen 118 may be round or polygonal in shape, and may be stationary or movable relative to the base 140.

Generally, a chemical mechanical polishing process is performed at each polishing station 132 by moving the substrate 122 retained in the polishing head 152 and the polishing material 102 supported on the polishing station 132 relative to each other. A polishing motion between the substrate 122 and the polishing material 102 may be linear, rotary, orbital, combinations thereof or other motion. The polishing motion may be provided by moving the polishing material 102, the polishing head 152, the platen 118 or any combination thereof.

The polishing material 102 may be advanced across or releasably fixed to the polishing surface. Typically, the polishing material 102 is releasably fixed by adhesives, vacuum, mechanical clamps or by other holding methods to platen 118 disposed in the polishing station 132.

The polishing material 102 is typically a pad, a web (i.e., a sheet of polishing material disposed between two rolls) or a continuous belt. In the embodiment depicted in FIG. 1, one of the polishing stations 132 includes polishing material 102 in the form of a fixed abrasive sheet 160. The fixed abrasive sheet 160 generally includes a plurality of abrasive particles suspended in a resin binder that is disposed in discrete elements on a backing sheet. The web of polishing material 102 may optionally comprise conventional polishing material without abrasives, for example, polyurethane and/or polyurethane mixed with fillers. The polishing material 102 disposed on the other polishing stations 132 utilize conventional polishing media 162. Conventional polishing media 162 is available from a number of sources, such as those commercially available from Rodel, Inc., of Newark, Del.

A conditioning device 182 is typically disposed on the base 140 adjacent each polishing station 132. The conditioning device 182 periodically conditions the polishing material 102 to maintain uniform polishing results.

The polishing head 152 is generally coupled to the carousel 134 by a drive system 106. The drive system 106 generally provides motion to the polishing head 152 during processing. In one embodiment, the polishing head 152 is a TITAN HEAD™ wafer carrier manufactured by Applied Materials, Inc., Santa Clara, Calif. Generally, the polishing head 152 retains the substrate 122 during processing and transfer between polishing stations 132.

The transfer station 136 generally facilitates substrate transfer to the polisher 100 from the robot 104 to one of the polishing heads 152 by the load cup assembly 148. In one embodiment, the transfer station 132 includes a transfer robot 146, an input buffer 142, an output buffer 144 and the load cup assembly 148. The input buffer station 142 receives a substrate 122 from the loading robot 104. The transfer robot 146 moves the substrate 122 from the input buffer station 142 and to the load cup assembly 148 where it may be transferred to one of the polishing heads 152 positioned over the transfer station 136 by the carousel 134. The transfer robot 146 additionally transfers polished substrates from the load cup assembly 148 to the output buffer 144 where they are removed from the polisher 100 by the loading robot 104. An example of a transfer station that may be used to advantage is described in U.S. Pat. No. 6,156,124, issued Dec. 5, 2000, which is incorporated herein by reference in its entirety.

Figure 2:
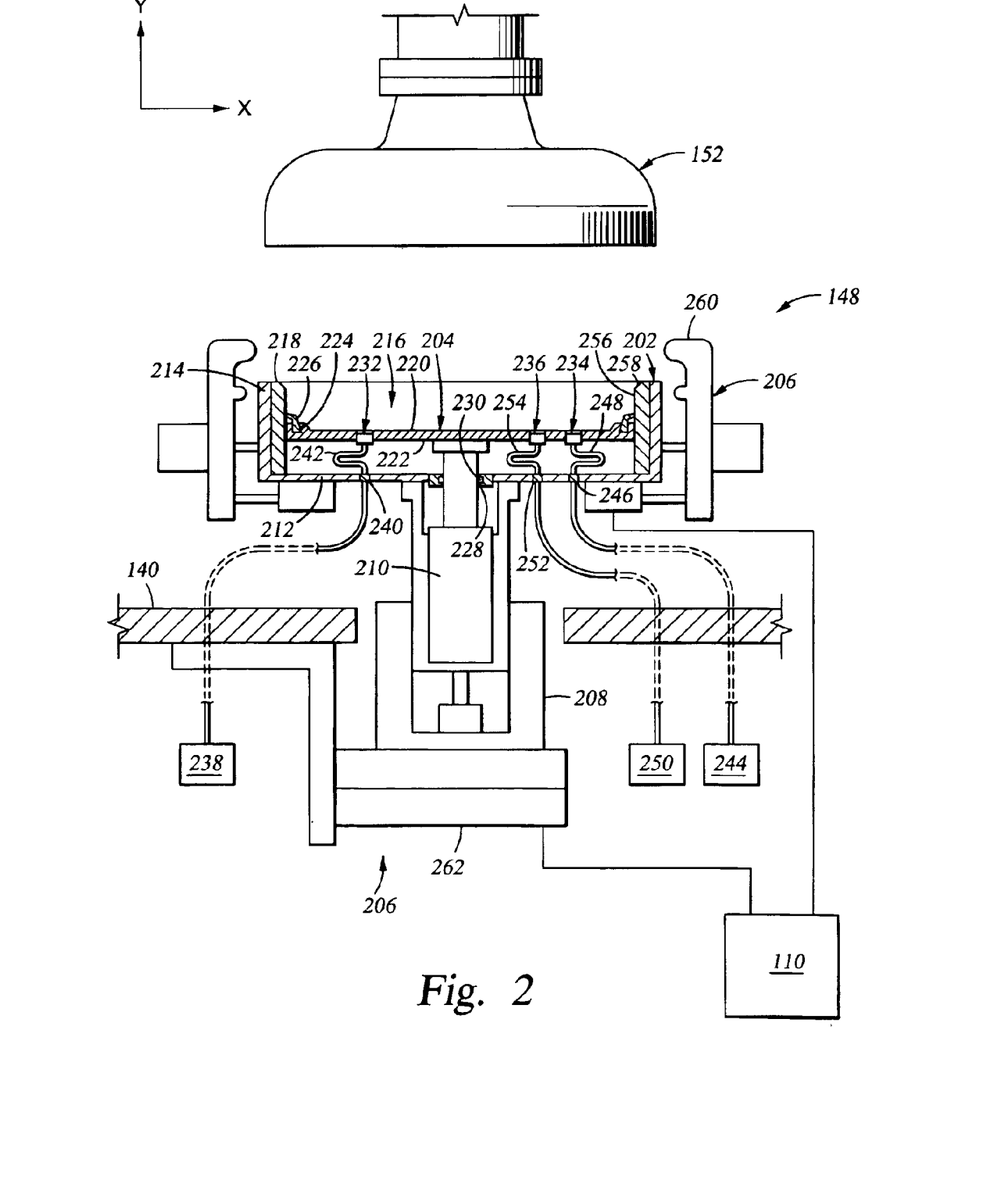
FIG. 2 is a sectional view of one embodiment of a load cup assembly shown below a polishing head.

FIG. 2 depicts a sectional view of one embodiment of the load cup assembly 148 shown below the polishing head 152. The load cup assembly 148 generally includes a basin 202, a lift plate 204 and a position correction system 206. The basin 202 is coupled to the base 140 by a main actuator 208. The main actuator 208 may be a pneumatic cylinder, hydraulic cylinder, ball screw, lead screw or other linear motion device adapted to control the elevation of the basin 202 relative to the base 140 and polishing head 152. The lift plate 204 is disposed within the basin 202 and coupled thereto by a plate actuator 210. The lift plate 204 supports the substrate while positioned within the load cup assembly 148. The plate actuator 210 may be a pneumatic cylinder, hydraulic cylinder, ball screw, lead screw or other linear motion device adapted to control the elevation of the lift plate 204 (and substrate) relative to the basin 202.

The basin 202 is typically fabricated from a rigid material suitable for use in a wet environment, such as plastic or stainless steel. The basin 202 includes a bottom 212 and a circumscribing lip 214 that defines an interior volume 216.

A liner 218 is disposed immediately inward of the circumscribing lip 214 and is typically fabricated from a material similar to the basin 202. The liner 218 has an inner diameter wall 256 that includes a radius or chamfer 258. The chamfer 158 is typically oriented at an acute angle relative to a central axis of the lift plate 204 to guide substrates into the inner volume 216 of the load cup assembly 148.

The bottom 212 of the basin 202 includes an aperture 228 to facilitate coupling of the lift plate 204 and the plate actuator 210. A seal 230 may be disposed in the aperture 228 between the bottom 212 and plate actuator 210 to prevent fluids, disposed in the interior volume 216 of the basin 202, from leaking.

The lift plate 204 is typically fabricated from a rigid material suitable for use in a wet environment, such as plastic or stainless steel. The lift plate 204 has a first side 220 that faces the substrate and a second side 222 that is coupled to the plate actuator 210. The first side 220 of the lift plate 204 includes a groove 224 disposed near the outer perimeter of the lift plate 204 to accept and retain a lift seal 226. The lift seal 226 may alternatively be coupled to the lift plate 204 in other configurations.

Figure 3:
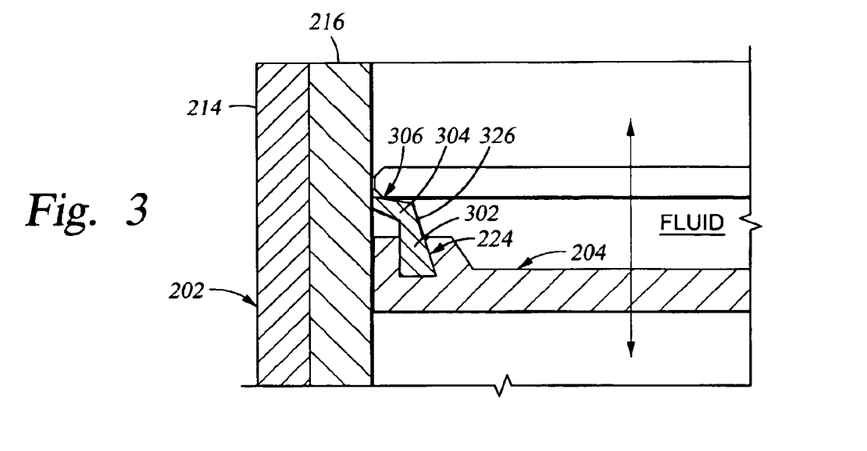
FIG. 3 one embodiment of a lift seal.

FIG. 3 depicts one embodiment of the lift seal 226. The lift seal 226 is typically fabricated from an elastomer or plastic material. The lift seal 226 includes a body 302 retained in the groove 224 of the lift plate 204 and has a lip 304 extended therefrom. The lip 304 is generally oriented radially outward from the body 302 and terminates in an end 306. The end 306 of the lift seal 226 typically contacts the liner 218 and supports the substrate thereon as the lift plate 204 is moved within the basin 202.

Returning to FIG. 2, a plurality of ports are disposed in the lift plate 204. In one embodiment, the ports include at least one fluid delivery port 232, at least one spray nozzle 234 and at least one drain port 236. The fluid delivery port 232 is coupled to a first fluid source 238 and is adapted to provide a fluid that supports the center portion of the substrate when disposed in the load cup assembly 148. A bulkhead fitting 240 is disposed in the bottom 212 of the basin 202 to couple the fluid delivery port 232 to the first fluid source 238 in a leak free manner. A predefined length of flexible tubing 242 is coupled between the bulkhead fitting 240 and the fluid delivery port 232 to allow movement between the lift plate 204 and basin 202 without disrupting the flow path between the port 232 and the first fluid source 238.

The fluid delivery port 232 additionally may be utilized to fill the load cup assembly 148 to create a fluid layer that wets the bottom substrate retained in the polishing head 152 during transfer of the substrate from the polishing head 152 to the load cup assembly 148. The fluid layer retained in the load cup assembly 148 develops a surface tension between the substrate and the load cup assembly 148 that uniformly pulls the substrate from the polishing head 152 as the polishing head 152 and load cup assembly 148 are separated, thus, advantageously preventing bowing of the substrate during transfer. Moreover, the use of surface tension of the fluid disposed in the load cup assembly 148 facilitates substrate transfer between the polishing head 152 and load cup assembly 148 without substrate contact, thereby eliminating a potential source of particulate generation.

The spray nozzle 234 is coupled to a second fluid source 244 and is adapted to spray a cleaning fluid to rinse the substrate after polishing and to optionally rinse the polishing head 152 as desired. A bulkhead fitting 246 is disposed in the bottom 212 of the basin 202 to couple the spray nozzle 234 to the second fluid source 244 in a leak free manner. A predefined length of flexible tubing 248 is coupled between the bulkhead fitting 246 and the spray nozzle 234 to allow movement between the lift plate 204 and basin 202 without disrupting the flow path between the nozzle 234 and the second fluid source 244.

The drain port 236 is coupled to an effluent tank 250 and is adapted to remove fluid from the interior volume 216 of the basin 202 as desired. A bulkhead fitting 252 is disposed in the bottom 212 of the basin 202 to couple the drain port 236 to the effluent tank 250 in a leak free manner. A predefined length of flexible tubing 254 is coupled between the bulkhead fitting 252 and the drain port 236 to allow movement between the lift plate 204 and basin 202 without disrupting the flow path between the port 236 and the effluent tank 250. Alternatively, the drain port 236 and one of the fluid delivery ports 234 may be configured as a single port utilizing one or more valves (not shown) to select flow between the first fluid source 238 and the effluent tank 250.

Figure 4:
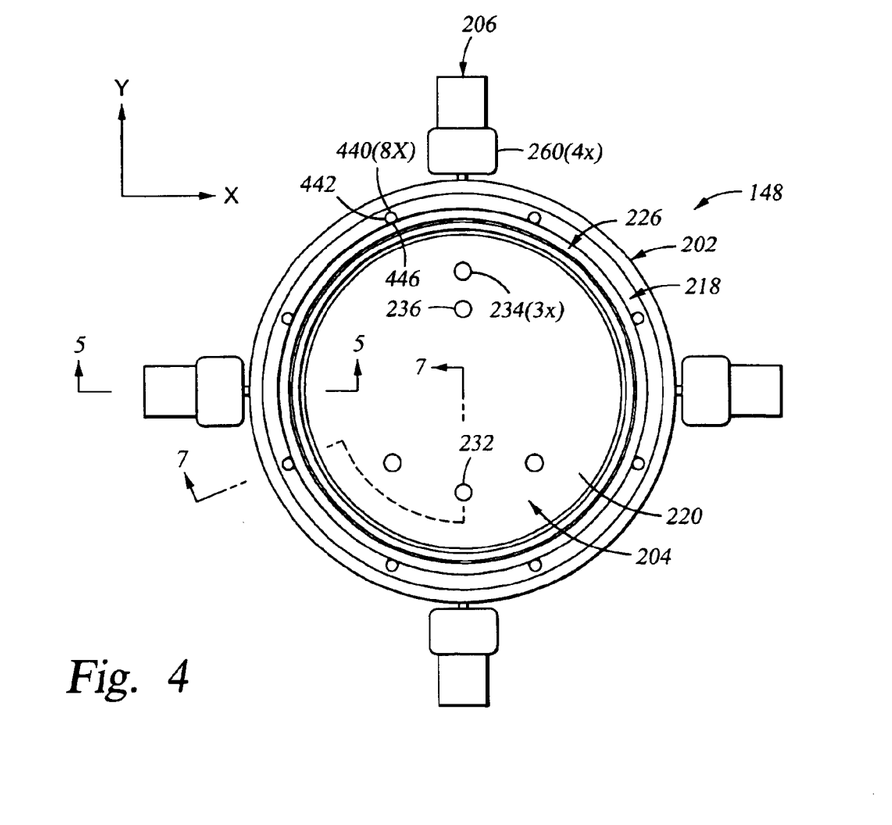
FIG. 4 is a plan view of the load cup assembly of FIG. 2.

Referring to FIGS. 2 and 4, the position correction system 206 typically includes a plurality of calipers 260 and a positioning mechanism 262. The calipers 260 are typically coupled to the basin 202 and are adapted to determine the relative position of the load cup assembly 148 and the polishing head 152. In one embodiment, the calipers 260 are orientated in orthogonal pairs to obtain positional information along perpendicular axis's. The positioning mechanism 262 is typically coupled between the load cup assembly 148 and the base 140. The positioning mechanism 262 is adapted to position the load cup assembly 148 based on the positional information obtained by the calipers 260. Alternatively, the positioning mechanism 262 may be coupled to each polishing head 152 or part of a drive system (not shown) controlling the motion of the polishing head 152 to move the polishing head 152 into alignment with a load cup stationary in the X/Y plane.

Figure 5A:
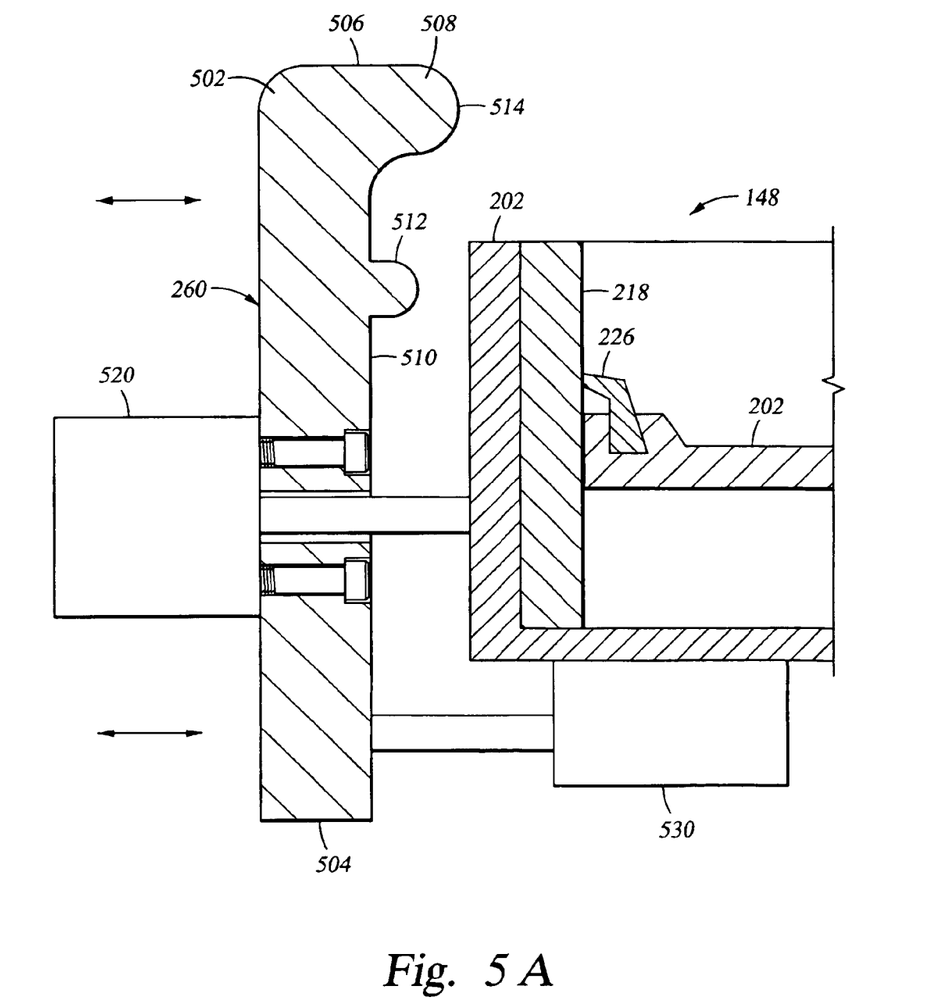
FIGS. 5A–B are partial sectional views of the caliper taken along section line 5—5 of FIG. 4.
Figure 5B:
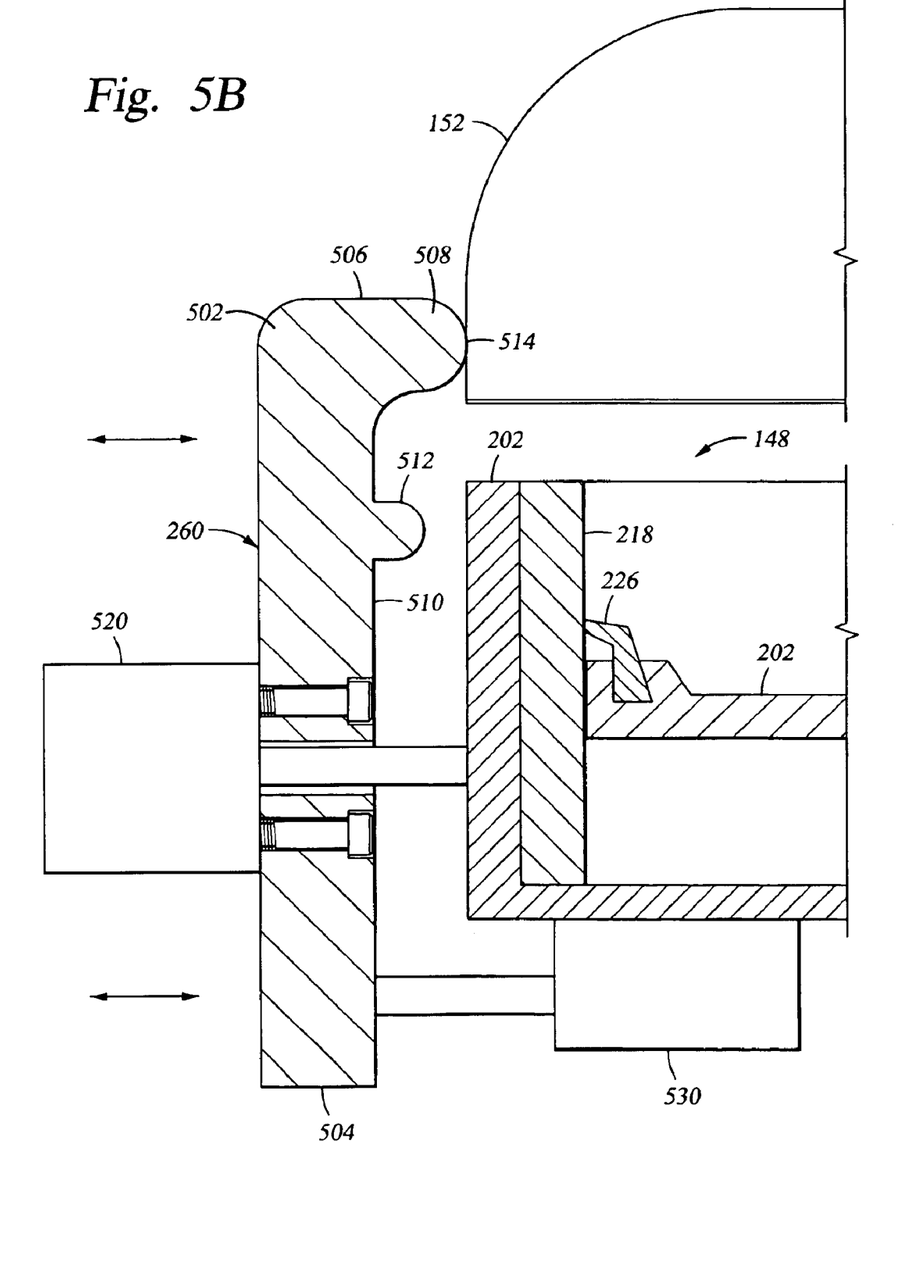

FIGS. 5A–B are partial sectional views of the caliper 260 taken along section line 5—5 of FIG. 4. Referring to both FIGS. 5A–B, the caliper 260 includes a body 502 having a first end 504 and a second end 506. A first flange 508 projects from a first side 510 of the body 502 proximate the second end 506. The first flange 508 terminates in a first end 514 that is adapted to contact the polishing head 152 upon movement of the caliper 260 inward. A second flange 512 also projects from the first side 510 of the body 502 between the first flange 508 and the first end 504 that is adapted to contact the basin 202 of the load cup assembly 148 upon movement of the caliper 260 inward. The first flange 508 generally extends farther from the body 502 to allow the first flange 508 to contact the polishing head 152 while the second flange 512 is clear of the basin 202.

The caliper 260 is coupled to the basin 202 by an actuator 520. The actuator 520 may be a pneumatic cylinder, a ball screw or other linear motion device. The actuator 520 is configured to move the caliper 260 radially toward and away from the center of the basin 202.

An encoder or other device is utilized to provide the controller 110 with a metric indicative of the position of each of the calipers 260. In one embodiment, an encoder, such as a LVDT 530, is coupled between the caliper 260 and the basin 202. As the caliper 260 is moved relative to the basin 202, each LVDT 530 provides the controller 110 with an independent positional metric. For example, the actuator 520 may move the caliper 260 inward until the second flange 512 contacts the exterior of the basin 202. In this position, the LVDT 530 provides the controller 110 with a reference position of the basin 202 of the load cup assembly 148. Once the polishing head 152 is lowered (or the load cup assembly 148 is raised) to exchange a substrate with the load cup assembly 148, the actuator 520 moves the caliper 260 inward until the first flange 508 of the caliper 260 contacts the exterior of the polishing head 152. In this position, the LVDT 530 provides the controller 110 with a position of the polishing head 152. Using positional metric information from each quadrant of the load cup assembly 148 obtained by the LVDTs 530 positioned around the basin 202, the controller 110 then resolves the relative position of the polishing head 152 and the basin 202 of the load cup assembly 148. It is contemplated that other positioning indicators may alternatively be utilized in place of the LVDT 530, for example, linear encoders, rotary encoders optical measuring devices, and the like.

Figure 6A:
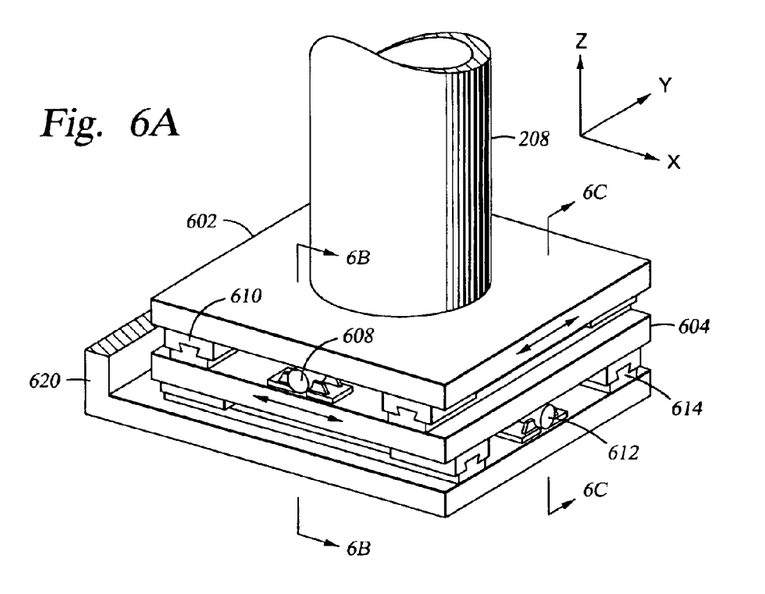
FIG. 6A is a perspective view of one embodiment of the positioning mechanism.
Figure 6B:
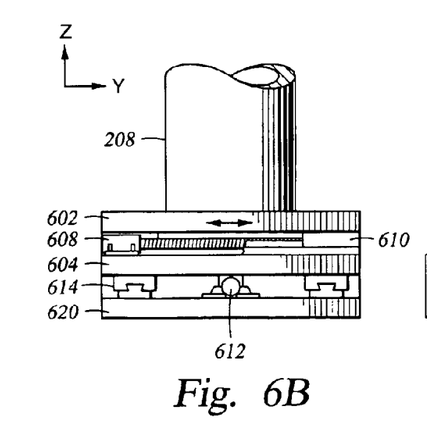
FIGS. 6B–C are sectional views of the positioning mechanism of FIG. 6A.
Figure 6C:
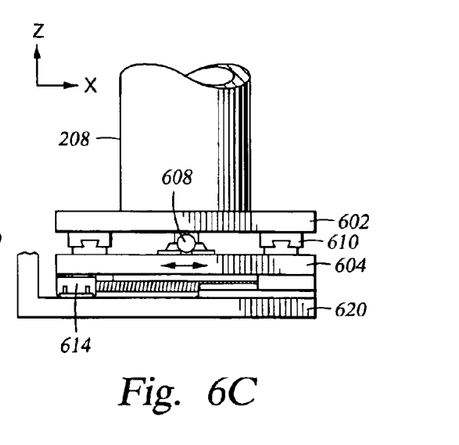

FIGS. 6A–C depicts a perspective and exploded views of one embodiment of the positioning mechanism 262. The positioning mechanism 262 is generally an X/Y table coupling the main actuator 208 to the base 140. The positioning mechanism 262 is adapted to move the load cup assembly 148 in response to the resolved relative position of the polishing head 152 and the basin 202 of the load cup assembly 148 into alignment with the polishing head 152 to facilitate substrate transfer.

The positioning mechanism 262 includes a carrier 602 movably coupled to a stage 604. The carrier 602 is coupled to the main actuator 208 of the load cup assembly 142. The carrier 602 is also coupled to the stage 604 by a first linear actuator 608 that is adapted to move the carrier 602 relative to the stage 604 in a first direction, for example, along a Y axis. One or more bearings 610 may be disposed between the carrier 602 and the stage 604 to facilitate movement therebetween. The first linear actuator 608 may be a ball or lead screw coupled to a motor or other device adapted to linearly position the carrier 602 relative to the stage 604.

The stage 604 is coupled the carrier 602 by a bracket 620 that is fastened to the base 140. The stage 604 is coupled to the carrier 602 by a second linear actuator 612 that is adapted to move the stage 604 relative to the base 140 in a second direction, for example, along an X axis. One or more bearings 614 may be disposed between the stage 604 and the base 140 to facilitate movement therebetween. The second linear actuator 612 is similar to the first linear actuator 608.

The combined motion provided by the first and second linear actuators 608, 612 allows the basin 202 coupled to the carrier 602 to be moved within the X/Y plane. Thus, in response to misalignment between the load cup assembly 148 and the polishing head 152 detected by the LVDT 530 (shown in FIGS. 5A–B), the positioning mechanism 262 moves the load cup assembly 148 into alignment with the polishing head 148 to facilitate substrate transfer. As the alignment between the polishing head 148 and load cup assembly 148 is checked and corrected at each substrate transfer, substrate damage during substrate transfer is advantageously minimized. Moreover, when more than one polishing head interfaces with a single load cup assembly 148, positional variation between the polishing heads is automatically compensated without need of costly tight component and assembly tolerances, frequent calibration, or field adjustment.

Referring back to FIG. 4, a plurality of alignment pins 440 are utilized to maintain substrate alignment within the load cup assembly 148. The pins 440 are typically disposed in a polar array about a central axis of the lift plate 204. Each pin 440 is disposed in a notch 442 formed in the inner diameter wall 256 of the liner 218. The pins 440 are orientated parallel with the central axis of the lift plate 204 having an outer surface 446 flush with the wall 256.

Figure 7A:
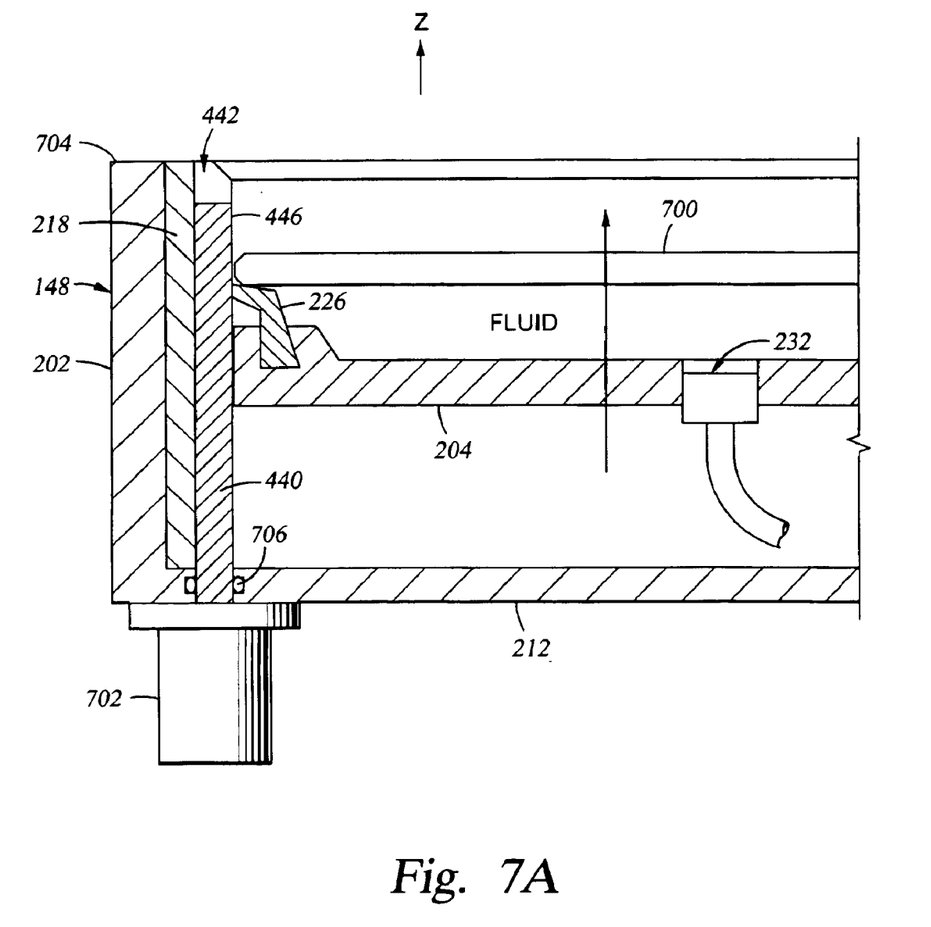
FIG. 7A is a sectional view of one embodiment of the alignment pin taken along section line 7—7 of FIG. 4.
Figure 7B:
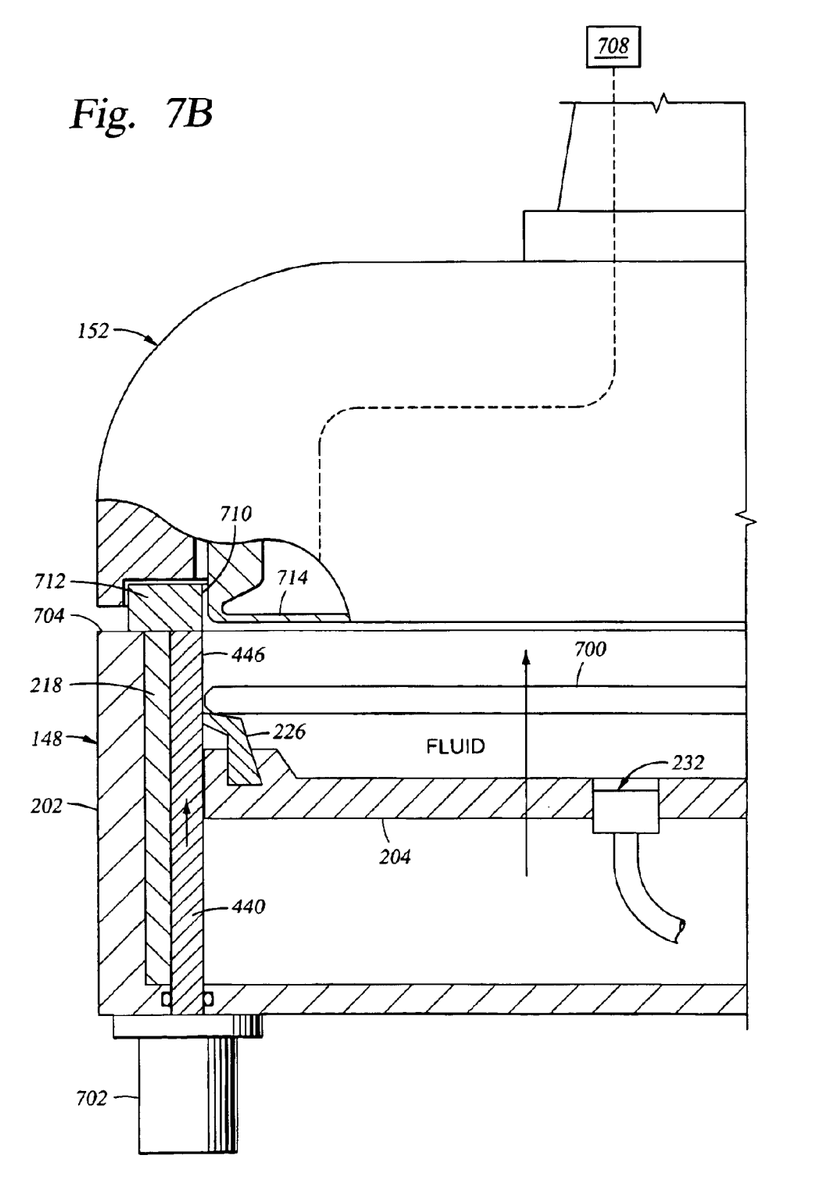
FIGS. 7B–C are sectional views of the load cup assembly depicting the transfer of a substrate taken along section line 7—7 of FIG. 4.
Figure 7C:
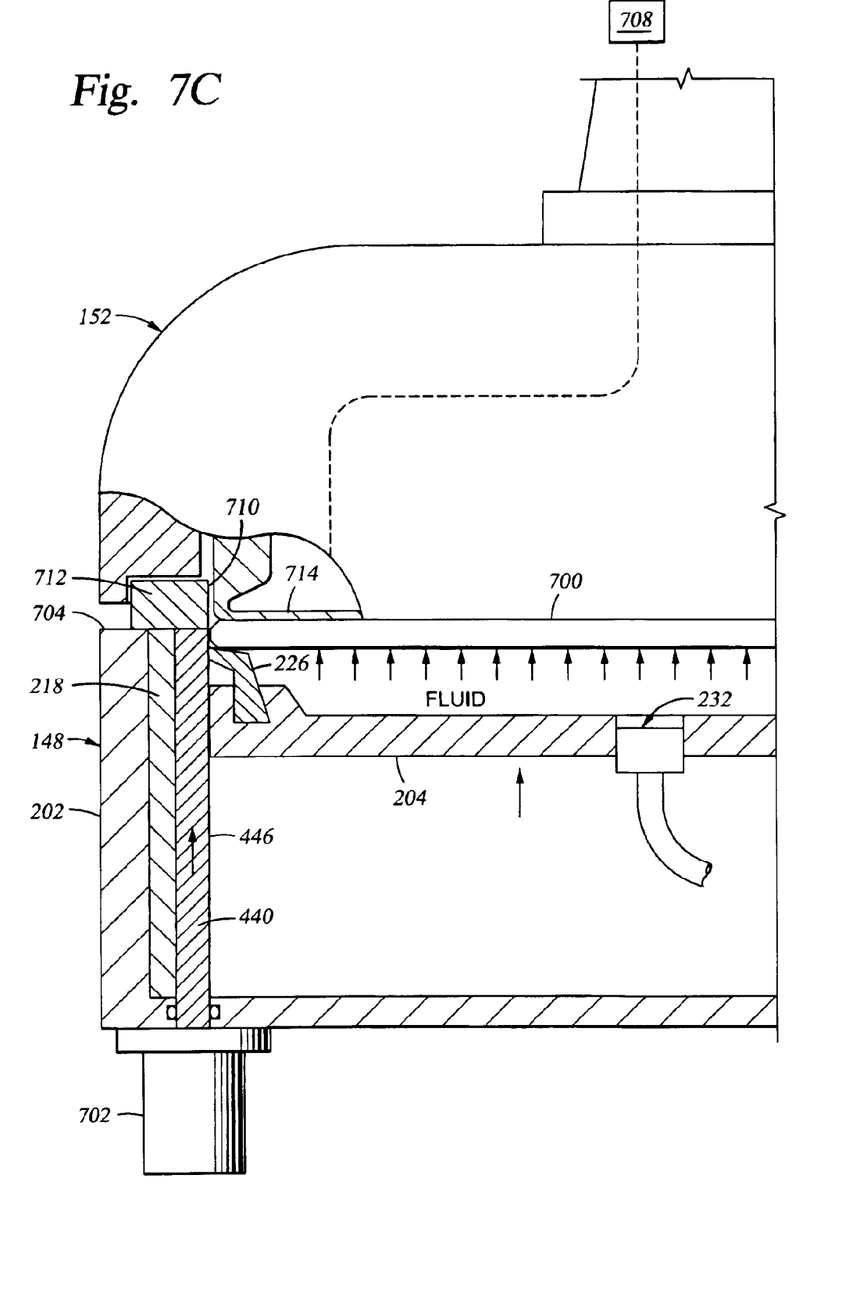

FIGS. 7A–C depict sectional views of one embodiment of the alignment pin 440 taken along section line 7—7 of FIG. 4. Each pin 440 is adapted to move parallel to a central axis of the lift plate 204 that is oriented along a Z axis. Typically, each pin 440 passes through the bottom 212 of the basin 202 and is coupled to a pin actuator 702 that controls the elevation of the pin 440 relative to the basin 202. Each pin 440 may have a dedicated pin actuator 702, or any number of pins 440 may share a single pin actuator 702. The pin actuator 702 may be a solenoid, motor, cam, linear actuator or other device capable of controlling the elevation of the pin 440. A seal 706 may be disposed between the bottom 212 of the basin 202 and the pin 440 to prevent fluid leakage.

The outer surface 446 of the pins 440 locate a substrate 700 concentrically within the load cup assembly 148. After the polishing head 152 has been aligned with the load cup assembly 152 as described above, the main actuator 208 is energized to raise the load cup assembly 148 against the polishing head 152. The pin actuator 702 then elevates the pins 440 substantially flush with a top surface 704 of the basin 202. As the polishing head 152 and load cup assembly 148 are aligned, the outer surface 446 of the pins 440 is substantially flush with an inner surface 710 of a retaining ring 712 of the polishing head 152, thus providing an alignment bearing for the transfer of the substrate 700 from the load cup assembly 148 to the polishing head 152.

The plate actuator 210 is then energized to elevate the lift plate 204 and substrate 700 seated on the seal 226 toward the polishing head 152. The substrate 700 moves inside the retaining ring 712 and comes in contact with a bladder 714 of the polishing head 152. The bladder 714 is typically inflated by providing gas from a gas source 708 to contact the substrate 700 then deflated to establish a vacuum therebetween that secures the substrate 700 to the polishing head 152. Fluid pressure, provided between the substrate 700 and the lift plate 204 through the fluid delivery port 232, keeps the substrate 700 from bowing during transfer. The seal 226 provided at the perimeter of the lift plate 204 and substrate 700 allows the fluid to be maintained between the substrate 700 and lift plate 204 so that pressure therebetween may be maintained at a predetermined level.

In one exemplary mode of operation, transferring a substrate using the load cup assembly 148 begins with positioning a processed substrate retained in the polishing head 152 over the load cup assembly 148. The substrate is typically rinsed by spraying fluid from the spray nozzles 234.

The calipers 260 are actuated to contact the basin 202 and obtain a reference coordinate of the load cup assembly 148. The calipers 260 are extended and the main actuator 208 elevates the load cup assembly 148 to a position proximate the polishing head 152. The calipers 260 are actuated to contact the polishing head 152 and the relative position of the load cup assembly 148 and polishing head 152 is resolved.

The calipers 260 are extended to clear the polishing head 152. The positioning mechanism 262 laterally aligns (if necessary) the load cup assembly 148 and polishing head 152 by moving at least one of the load cup assembly 148 or polishing head 152. With the load cup assembly 148 and polishing head 152 aligned, the main actuator 208 elevates the load cup assembly 148 to contact (or to close proximity) the polishing head 152.

The pins 440 are extended to contact the retaining ring 712 of the polishing head 152, thus providing a substantially concentric guide for the substrate to move between the load cup assembly 148 and the polishing head 152. The lift plate 204 is elevated by the plate actuator 210 to receive the substrate from the polishing head 152. Fluid is flowed between the substrate and lift plate 204 through the fluid delivery port 232 to float the substrate, minimizing contact with the surfaces of the load cup assembly 148. Additionally, the fluid may pressurized in a region defined between lift plate 204 and substrate seated thereon to prevent bowing of the substrate during substrate transfer.

After the processed substrate is removed from the load cup assembly 148, the pins 440 are lowered and a new substrate to be processed is transferred to the load cup assembly 148 by the transfer robot 156. The calipers 260 are actuated to determine the reference position of the load cup assembly 148. The calipers 260 are extended and the main actuator 208 elevates the load cup assembly 148 to a position proximate the polishing head 152. The calipers 260 are actuated to contact the polishing head 152 and the relative position of the load cup assembly 148 and polishing head 152 is resolved by the controller 110.

The calipers 260 are extended to clear the polishing head 152. The positioning mechanism 262 laterally aligns (if necessary) the load cup assembly 148 and polishing head 152 by moving at least one of the load cup assembly 148 or polishing head 152. With the load cup assembly 148 and polishing head 152 aligned, the main actuator 208 elevates the load cup assembly 148 to contact (or to close proximity) the polishing head 152.

The pins 440 are extended to contact the retaining ring 712 of the polishing head 152. The lift plate 204 is elevated to transfer the substrate while riding on the seal 226 to the polishing head 152. Fluid is flowed between the substrate and lift plate 204 through the fluid delivery port 232 to support the center region the substrate and to prevent substrate bowing during substrate transfer.

Figure 8:
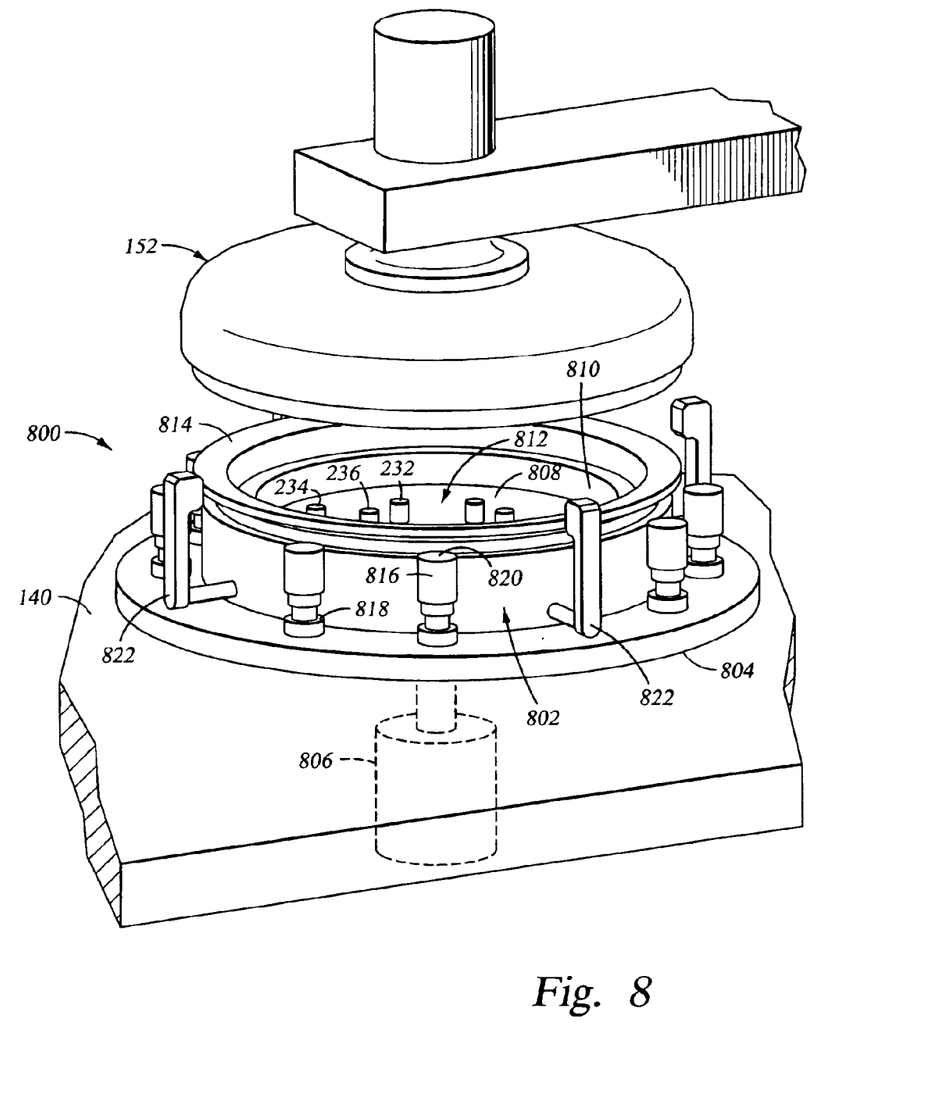
FIG. 8 is a perspective view of another embodiment of a load cup assembly.

FIG. 8 is a perspective view of another embodiment of a load cup assembly 800 shown below a polishing head 152. The load cup assembly 800 includes a basin 802 disposed on a base plate 804. The base plate 804 is coupled to a main actuator 806 (shown in phantom) that controls the elevation of the load cup assembly 800 relative to the polishing head 152.

The basin 802 includes a bottom 808 and a lip 810 extended upward from the perimeter of the bottom 808 to define an interior volume 812. Fluid delivery ports 232, drain ports 236 and spray nozzles 234 similar to those described above are disposed on the bottom 808 of the basin 802.

A seal 814 is disposed on the upper end of the lip 810 to support the substrate thereon. The seal 814 is generally similar to the seal 226 described above. The seal 814 is generally an elastomer or plastic and may be an o-ring, gasket, lip seal, cup seal or other type of seal that substantially prevents fluid from freely flowing between the lip and the substrate thus allowing the center portion of the substrate to be supported by fluid flowed into the interior volume 812 through the fluid delivery port 232.

A plurality of alignment pins 816 are coupled to the base plate 804 circumscribing the basin 802. The alignment pins 816 are coupled to one or more pin actuators 818, similar to the alignment pins described above. The alignment pins 816 may be actuated between a first position (as shown in FIG. 8) and a second position. In the first position, a distal end 820 of the pin 816 is disposed below the plane of the seal 814. After the substrate is concentrically aligned on the basin 802, the pins 816 may be actuated away from the base plate 804 to the second portion where the end 820 extends above the elevation of the lip 810 of the basin 802 and the seal 814. In the elevated position, the substrate is held concentric to the basin 802 between the pins 816.

Figure 9:
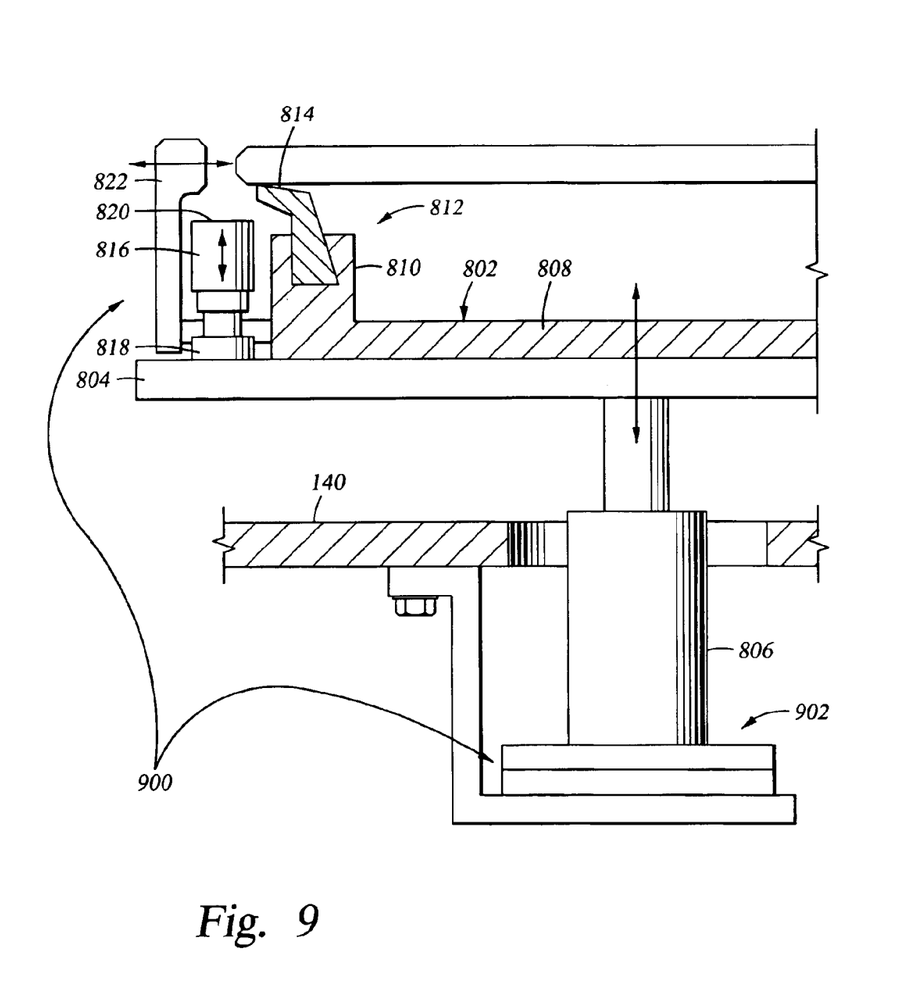
FIG. 9 is a partial sectional view of the load cup assembly of FIG. 8.

Referring additionally to the partial sectional view of the load cup assembly 800 depicted in FIG. 9, the main actuator 806 is coupled to the base 140 of the polishing system by a control system 900. The control system 800 is utilized to align the substrate to the basin 802 in a first mode and to align the load cup assembly 800 to the polishing head 152 positioned over the load cup assembly 800 in a second mode. The control system 900 typically includes a plurality of calipers 822 and a positioning mechanism 902.

The calipers 822 are typically coupled to the basin 802 and are adapted to determine the relative position of the load cup assembly 800 and the polishing head 152 as described above. Additionally, the calipers 822 are adapted to center the substrate on the basin 802. In one embodiment, the calipers 822 are orientated in orthogonal pairs to obtain positional information along perpendicular axis's. The positioning mechanism 902 is adapted to position the load cup assembly 800 concentrically below the polishing head 152 based on the positional information obtained by the calipers 822. The positioning mechanism 902 is generally similar to the positioning system 262 described above. Alternatively, the positioning mechanism 902 may be coupled to each polishing head 152 or part of a drive system (not shown) controlling the motion of the polishing head 152 to move the polishing head 152 into alignment with a load cup stationary in the X/Y plane.

In another exemplary mode of operation, transferring a substrate using the load cup assembly 800 begins with positioning a processed substrate retained in the polishing head 152 over the load cup assembly 800. The substrate is typically rinsed by spraying fluid from the spray nozzles 234.

The calipers 822 are actuated to contact the basin 802 and obtain a reference coordinate of the load cup assembly 800. The calipers 802 are extended and the main actuator 806 elevates the load cup assembly 800 to a position proximate the polishing head 152. The calipers 822 are actuated to contact the polishing head 152 and the relative position of the load cup assembly 800 and polishing head 152 is resolved.

The calipers 822 are extended to clear the polishing head 152. The positioning mechanism 902 laterally aligns (if necessary) the load cup assembly 800 and polishing head 152 by moving at least one of the load cup assembly 800 or polishing head 152. With the load cup assembly 800 and polishing head 152 aligned, the main actuator 806 elevates the load cup assembly 800 to contact (or to close proximity) the polishing head 152.

The pins 816 are in contact with the retaining ring 712 of the polishing head 152, thus providing a substantially concentric guide for the substrate to move between the load cup assembly 300 and the polishing head 152. The substrate is transferred from the polishing head 152 to the load cup assembly 800. Fluid is flowed between the substrate and the basin 802 through the fluid delivery port 232 to support the center of the substrate.

The load cup assembly 800 is lowered and the substrate is removed from the load cup assembly 148. The pins 816 are lowered and a new substrate to be processed is transferred to the load cup assembly 800 by the transfer robot 156. The calipers 822 are actuated to determine the center of the substrate in the load cup assembly 800. The calipers 822 are extended and the main actuator 806 elevates the load cup assembly 800 to a position proximate the polishing head 152. The calipers 822 are actuated to contact the polishing head 152 and the relative position of the load cup assembly 148 and polishing head 152 is resolved.

The calipers 822 are extended to clear the polishing head 152. The positioning mechanism 902 laterally aligns (if necessary) the load cup assembly 800 and polishing head 152 by moving at least one of the load cup assembly 800 or polishing head 152. With the load cup assembly 800 and polishing head 152 aligned, the main actuator 806 elevates the load cup assembly 800 to contact the pins 816 with the retaining ring 712 of the polishing head 152. The bladder of the polishing head is deflated to create a vacuum between the polishing head 152 and substrate. The substrate is retained in the polishing head 152 as the load lock assembly 800 is lowered to clear the polishing head 152.

Thus, the invention provides a method and apparatus to transfer a substrate to a polishing head while minimizing potential damage. The control system provides dynamic alignment correction without interruption of substrate transfer. Fluid floats the substrate within the load cup assembly to minimize particulate generation and supports the center of the substrate during transfer to minimize substrate bowing.

While the foregoing is directed to the preferred embodiment of the present invention, other and further embodiments of the invention may be devised without departing from the basic scope thereof. The scope of the invention is determined by the claims that follow.

Reference Numerals 100 chemical mechanical polisher
102 polishing material
104 loading robot
110 controller
112 central processing unit
114 memory
118 platen
122 substrates
132 polishing stations
134 carousel
136 transfer station
140 base
142 input buffer
144 output buffer
146 transfer robot
148 load cup assembly
150 arms
152 polishing heads
158 chamfer
160 sheet
162 polishing media
182 conditioning device
202 basin
204 lift plate
206 position correction system
208 main actuator
210 plate actuator
212 bottom
214 lip
216 interior volume
218 liner
220 first side
224 groove
226 lift seal
228 aperture
230 seal
232 fluid delivery port
234 spray nozzle
236 drain port
238 first fluid source
240 bulkhead fitting
242 tubing
244 second fluid source
250 effluent tank
252 bulkhead fitting
254 flexible tubing
260 calipers
262 positioning mechanism
302 body
304 lip
306 end
440 alignment pins
442 notch
446 outer surface
502 body
504 first end
506 second end
508 first flange
510 first side
512 second flange
514 first end
520 actuator
530 LVDT
602 carrier
604 stage
608 first linear actuator
610 bearings
612 second linear actuator
700 substrate
702 pin actuator
704 top surface
706 seal
708 gas source
710 inner surface
712 retaining ring
714 bladder
800 load cup assembly
802 basin
808 bottom
810 lip
812 interior volume
814 seal
816 alignment pins
818 pin actuator
820 distal end
822 calipers
900 control system
902 positioning mechanism

What is claimed is:

1. A load cup for transferring a substrate in a chemical mechanical polishing system, comprising:

a substrate support adapted to transfer the substrate to a polishing head along a central axis wherein a surface of the substrate support is adapted to retain a liquid bath thereon; and a first actuator coupled to the substrate support and adapted to move the substrate support laterally to the central axis.

2. The load cup of claim 1, wherein the substrate support further comprises:

a peripheral lip extending from the surface of the substrate support and defining a substrate receiving pocket with the the surface.

3. The load cup of claim 2, wherein the lip includes an inner diameter wall having at least a portion thereof disposed at an acute angle relative to the central axis.

4. The load cup of claim 1 further comprising:

a second actuator coupled to the substrate support and adapted to move the substrate support orthogonally to the first actuator.

5. The load cup of claim 1 further comprising:

at least a second actuator coupled to the substrate support and adapted to move the substrate support perpendicular to the central axis.

6. The load cup of claim 1, wherein the first actuator is adapted to move the substrate support in at least two directions perpendicular to an axis defined normal to the surface of the substrate support.

7. The load cup of claim 1 further comprising:

a second actuator coupled to the substrate support and adapted to move the substrate support within a plane defined perpendicular to the central axis; and a third actuator coupled to the substrate support and adapted to move the substrate support in the plane perpendicular to the central axis.

8. The load cup of claim 1 further comprising:

a sensor adapted to detect a position of the actuator.

9. The load cup of claim 1, wherein the liquid bath is adapted to support the substrate.

10. The load cup of claim 1 further comprising:

a plurality of pins projecting from the the surface of the substrate support and adapted to center the substrate relative to a central axis of the substrate support.

* * * * *